United States Patent
Fayrushin et al.

(10) Patent No.: US 7,760,550 B2
(45) Date of Patent: Jul. 20, 2010

(54) METHODS OF READING DATA FROM NON-VOLATILE SEMICONDUCTOR MEMORY DEVICE

(75) Inventors: Albert Fayrushin, Gyeonggi-do (KR); Byung-Yong Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 188 days.

(21) Appl. No.: 12/168,961

(22) Filed: Jul. 8, 2008

(65) Prior Publication Data

US 2009/0016110 A1    Jan. 15, 2009

(30) Foreign Application Priority Data

Jul. 10, 2007   (KR) .................... 10-2007-0068940

(51) Int. Cl.
*G11C 16/04*   (2006.01)
(52) U.S. Cl. .................... 365/185.18; 365/185.17; 365/185.25; 365/185.02; 365/185.03
(58) Field of Classification Search ............ 365/185.17, 365/185.03, 185.02, 185.21, 185.22, 185.25, 365/185.18
See application file for complete search history.

(56) References Cited

U.S. PATENT DOCUMENTS

2008/0316818 A1*   12/2008   Park et al. .............. 365/185.03

2009/0016110 A1*   1/2009   Choi et al. ............. 365/185.17

FOREIGN PATENT DOCUMENTS

| JP | 11086574 | | 3/1999 |
| JP | 2002133888 A | * | 5/2002 |
| JP | 2002133888 | | 10/2002 |
| KR | 0535651 | | 12/2005 |

* cited by examiner

*Primary Examiner*—Andrew Q Tran
(74) *Attorney, Agent, or Firm*—Volentine & Whitt, P.L.L.C.

(57) ABSTRACT

A method of reading data in a non-volatile memory device includes applying a bit line read voltage to a bit line and a selected cell read voltage to a word line, both of which are electrically connected to a selected cell located in a selected string. A first read voltage is applied to word lines electrically connected to first non-selected cells separated from the selected cell in the selected string, and a second read voltage is applied to word lines electrically connected to second non-selected cells adjacent to the selected cell in the selected string. The second read voltage is lower than the first read voltage. A pass voltage is applied to turn on a string select transistor and a ground select transistor, respectively, in the selected string. An electrical signal output from the selected string is compared with a standard signal to read data stored in the selected cell.

16 Claims, 7 Drawing Sheets

METHODS OF READING DATA FROM NON-VOLATILE SEMICONDUCTOR MEMORY DEVICE

CROSS-REFERENCE TO RELATED PATENT APPLICATION

A claim of priority is made to Korean Patent Application No. 10-2007-0068940, filed on Jul. 10, 2007, the subject matter of which is hereby incorporated by reference.

BACKGROUND OF THE INVENTION

1. Field of the Invention

Example embodiments of the present invention relate to a method of reading data from semiconductor memory devices. More particularly, example embodiments of the present invention relate to reading data in non-volatile semiconductor memory devices using different read voltages.

2. Description of the Related Art

A flash memory device is one type of non-volatile semiconductor memory device, which continuously maintains stored data. Data may be electronically programmed in or erased from flash memory devices. Further, flash memory devices may not require refresh operations. A flash memory device may be classified according to its structure as a NAND type flash memory device and a NOR type flash memory device.

In a NOR type flash memory device, a ground voltage VSS may be applied to a source region of a transistor in a memory cell to program or erase data in any address. The NOR type flash memory device typically has a relatively fast response speed. In a NAND type flash memory device, cell transistors are electrically connected to one another in serial to form unit strings, electrically connected to a source region and a drain region. The NAND type flash memory device typically has a higher degree of integration.

FIG. 1 is a circuit diagram illustrating a cell string of a NAND type flash memory device.

Referring to FIG. 1, the NAND type flash memory device includes a string select transistor SST and a ground select transistor GST. The memory cells are electrically connected to one another in serial between the string select transistor SST and the ground select transistor GST. One cell string may include 32 memory cells MC in the NAND type flash memory device, as illustrated in FIG. 1.

Each of the memory cells may be controlled by one word line, and the memory cells controlled by one word line may form one group of memory cells. Conventionally, reading data such as "0" or "1" may be performed by confirming a threshold voltage of the transistor in the memory cells.

For example, about 0V may be applied to a word line electrically connected to a selected cell, and a pass voltage for turning on non-selected cells may be applied to word lines electrically connected to non-selected cells regardless of data stored in the non-selected cells. The pass voltage may be applied to a string select line SSL and a ground select line GSL to turn on each of the transistors electrically connected to the string select line SSL and the ground select line GSL. After a voltage is applied to a bit line electrically connected to the selected cell, current in the selected cell may be confirmed. When the current is substantially higher than a standard current, it is confirmed that the selected cell is turned on. When the current is substantially lower than the standard current, it is confirmed that the selected cell is turned off. Generally, a threshold voltage of memory cells in a turned-on state may be substantially lower than about −3V, and a threshold voltage of memory cells in a turned-off state may be substantially higher than about 1V. Programmed cells may have a threshold voltage of about 1V.

However, as the degree of integration increases, distances between word lines decrease. This generates RC delay, coupling noise and/or disturbance between adjacent word lines, for example.

A voltage difference between the word line electrically connected to the selected cell and the word lines electrically connected to the non-selected cells adjacent to the selected cell may increase in a reading operation. Thus, the threshold voltage of the selected cell may be lowered considerably by the voltage difference. That is, a strong fringe field may be generated between the selected cell and the non-selected cells adjacent to the selected cell, lowering the threshold voltage of the selected cell.

SUMMARY OF THE INVENTION

Illustrative embodiments of the present invention provide a method of reading data stored in a selected cell of a non-volatile memory device.

According to one aspect of the present invention, there is provided a method of reading data in a non-volatile memory device. The method includes applying a bit line read voltage to a bit line electrically connected to a selected cell located in a selected string and applying a selected cell read voltage to a word line electrically connected to the selected cell. A first read voltage is applied to word lines electrically connected to first non-selected cells in the selected string and the first non-selected cells are separated from the selected cell. A second read voltage is applied to word lines electrically connected to second non-selected cells in the selected string and the second non-selected cells are adjacent to the selected cell. The second read voltage inhibits a fringe field affecting a threshold voltage of the selected cell and is substantially lower than the first read voltage. A pass voltage is applied to a string select line and a ground select line, electrically connected to the selected string, for turning on a string select transistor and a ground select transistor, respectively. An electrical signal output from the selected string is compared with a standard signal to read data stored in the selected cell.

In various embodiments, the first read voltage and the second read voltage may be substantially higher than a maximum threshold voltage of programmed memory cells. Also, the first read voltage may be substantially lower than a programming voltage for programming the memory cells. The second read voltage may be within a range of about 70% to about 90% of the first read voltage.

In various embodiments, the method may further include applying a voltage of about 0V to a common source line electrically connected to the selected string and a bulk substrate. The method may also include applying a voltage of about 0V to bit lines electrically connected to strings other than the selected string.

In various embodiments, the pass voltage may be substantially the same as the first read voltage.

According to another aspect of the present invention, there is provided a method of reading data stored in a selected cell in a selected string of a non-volatile memory device. The method includes applying a precharge voltage to at least one of word lines electrically connected to first non-selected cells, which are not adjacent to the selected cell in the selected string, and word lines electrically connected to second non-selected cells, which are adjacent to the selected cell in the selected string, to precharge at least one of the first non-selected cells and the second non-selected cells. A selected cell read voltage is applied to a word line electrically connected to the selected cell. A bit line read voltage is applied to a bit line electrically connected to the selected cell, while applying the precharge voltage. A pass voltage, for turning on a string select transistor and a ground select transistor electrically connected to the selected string, is applied while applying the precharge voltage. A first read voltage substantially higher than the precharge voltage is applied to the word lines electrically connected to the first non-selected cells after applying the precharge voltage. A second read voltage substantially higher than the precharge voltage and substantially lower than the first read voltage is applied to the word lines electrically connected to the second non-selected cells after applying the precharge voltage. An electrical signal output from the selected string is compared with a standard signal to read the data stored in the selected cell.

In various embodiments, applying the precharge voltage may include applying the precharge voltage to both the word lines electrically connected to the first non-selected cells and the word lines electrically connected to the second non-selected cells. Alternatively, applying the precharge voltage may include applying the precharge voltage to only the word lines electrically connected to the first non-selected cells, or applying the precharge voltage only to the word lines electrically connected to the second non-selected cells.

In various embodiments, the precharge voltage may be in a range of about 30% to about 80% of the second read voltage. The first-read voltage and the second read voltage may each be substantially higher than a maximum threshold voltage of programmed memory cells and substantially lower than a programming voltage for programming the memory cells. Also, the second read voltage may be in a range of about 70% to about 90% of the first read voltage.

In various embodiments, the method may further include applying a voltage of about 0V to bit lines electrically connected to strings other than the selected string. The pass voltage may be substantially the same as the first read voltage.

BRIEF DESCRIPTION OF THE DRAWINGS

The embodiments of the present invention will be described with reference to the attached drawings, in which.

DESCRIPTION OF THE INVENTION

Figure 1:
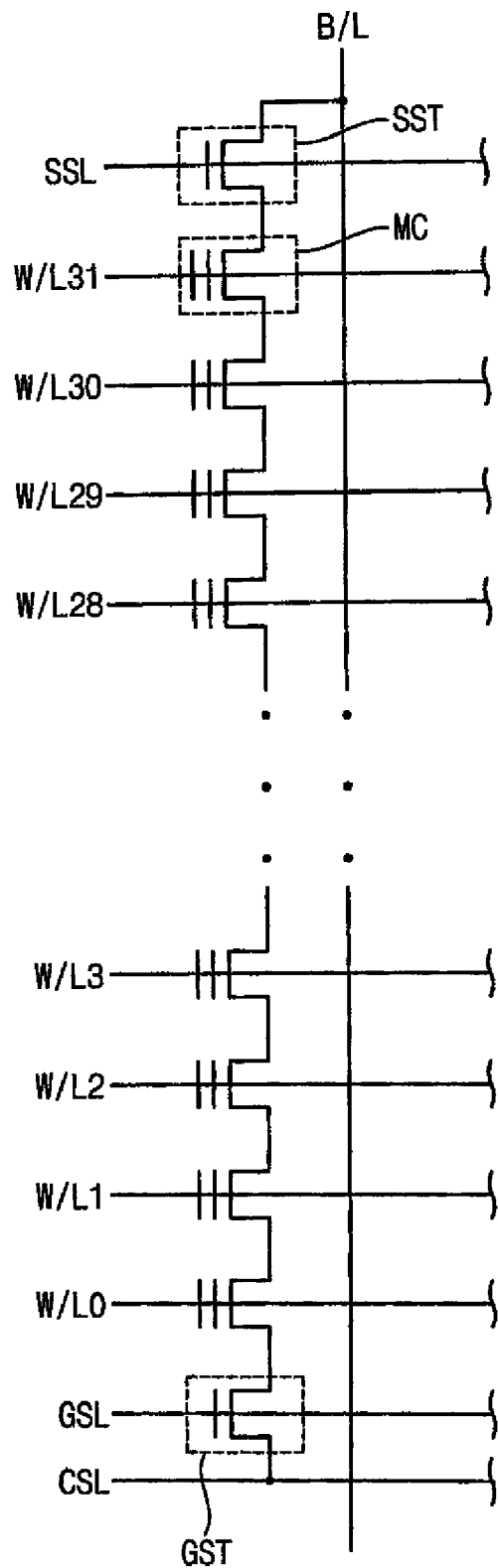
FIG. 1 is a circuit diagram illustrating a cell string of a NAND type flash memory device.

The present invention will now be described more fully with reference to the accompanying drawings, in which example embodiments of the invention are shown. The invention may, however, be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements. Also, in the drawings, sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although terms such as first, second, third, etc., may be used to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present invention.

Spatially relative terms, such as "beneath," "below," "lower," "above," "upper" and the like, may be used for ease of description to describe one element or feature's relationship to another element(s) or feature(s), for example, as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. Likewise, the device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification and claims, specify the presence of stated features, integers, steps, operations, elements and/or components, but do not preclude the presence or addition of one or more other features, integers, steps, operations, elements, components and/or groups.

Example embodiments of the invention are described with reference to cross-sectional illustrations that are schematic illustrations of the embodiments (and intermediate structures) of the present invention. As such, variations from the shapes of the illustrations as a result, for example, of manufacturing techniques and/or tolerances, are to be expected. Thus, the embodiments of the present invention should not be construed as limited to the particular shapes of regions illustrated in the figures, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and the depicted shapes are not intended to illustrate the exact actual shape of a corresponding region of a device, and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
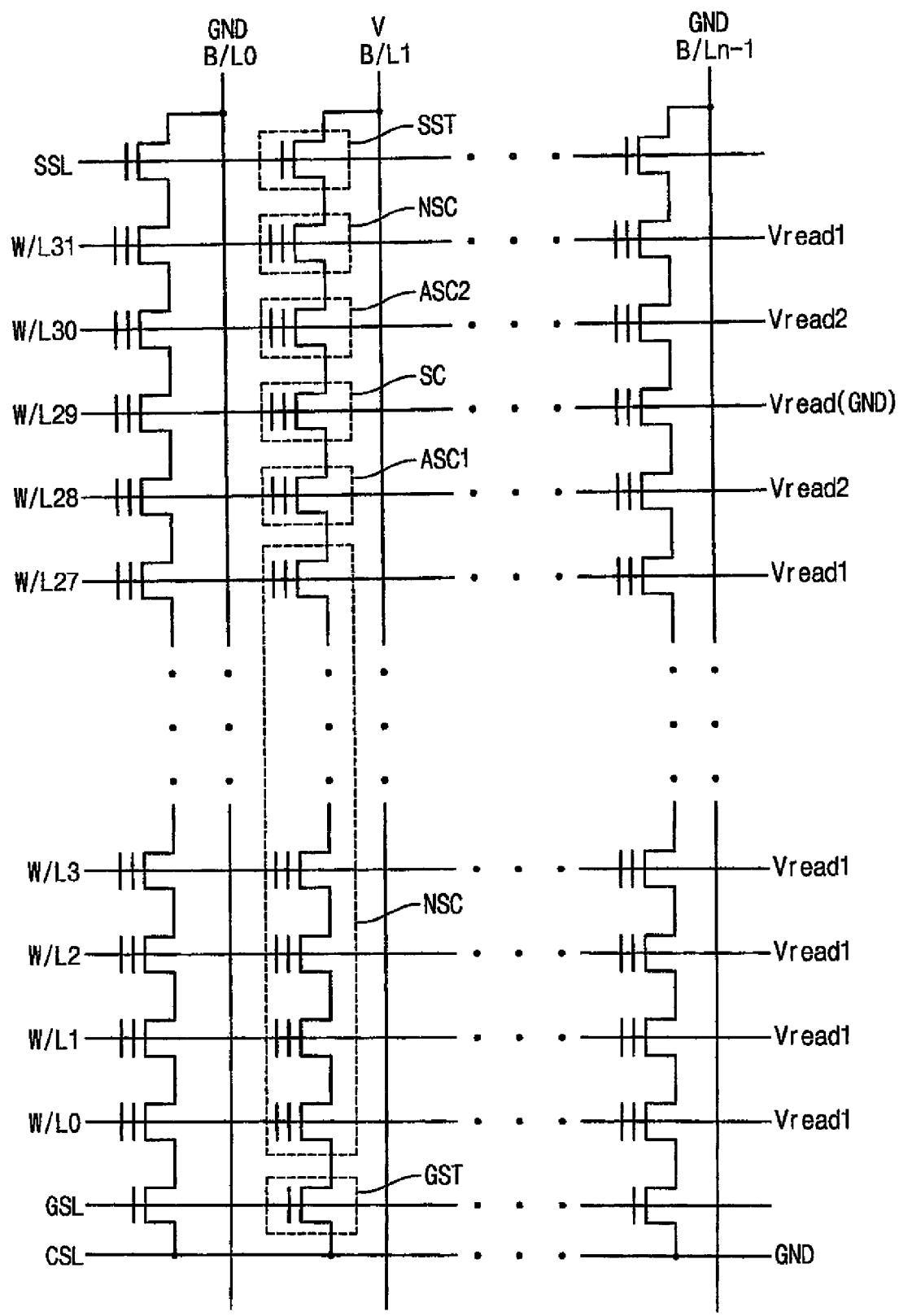
FIG. 2 is a circuit diagram illustrating a NAND type flash memory device having a selected cell from which data is read, in accordance with example embodiments of the present invention.
Figure 3:
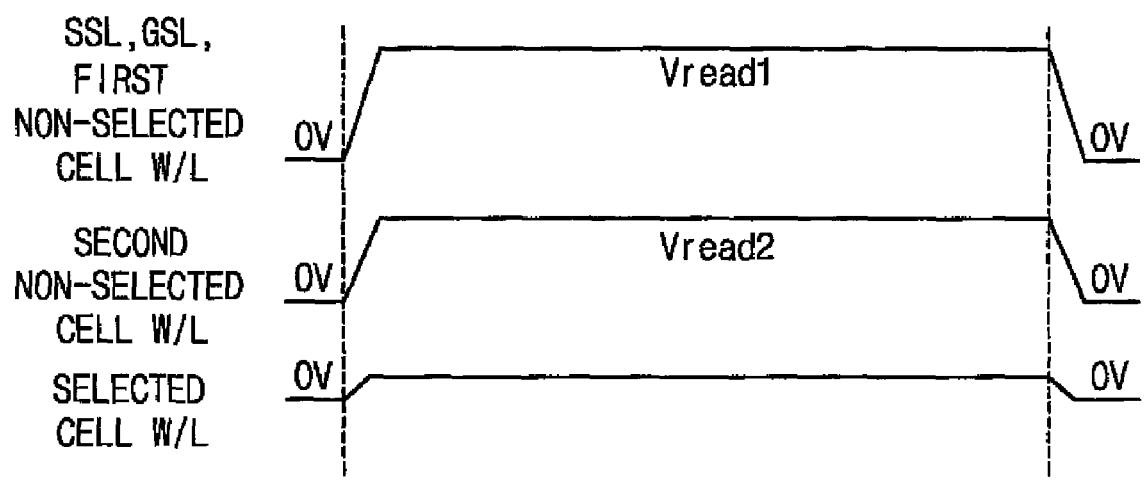
FIG. 3 is a timing diagram illustrating voltages applied to memory cells of a NAND type flash memory device, in accordance with example embodiments of the present invention.
Figure 4:
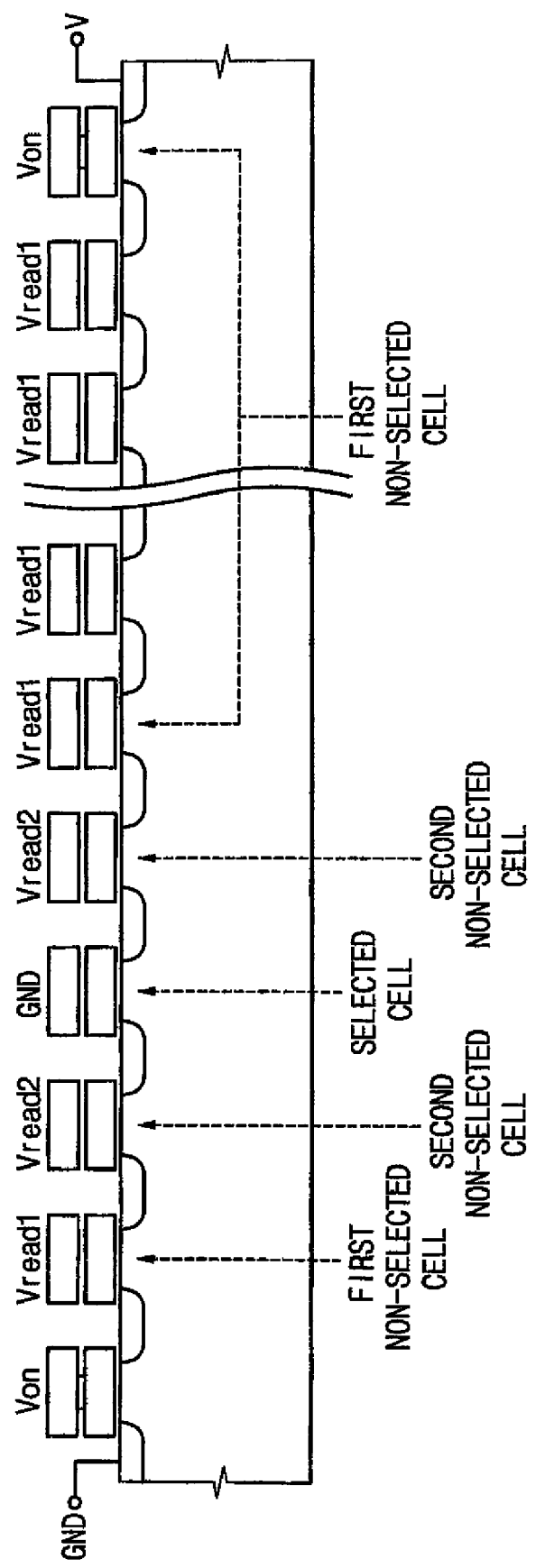
FIG. 4 is a cross-sectional view illustrating memory cells of a NAND type flash memory device, in accordance with example embodiments of the present invention.

FIG. 2 is a circuit diagram illustrating a NAND type flash memory device, from which data is read from a selected cell, in accordance with illustrative embodiments of the present invention. FIG. 3 is a timing diagram illustrating voltages applied to word lines electrically connected to elements in memory cells, in accordance with illustrative embodiments of the present invention. FIG. 4 is a cross-sectional view illustrating a NAND type flash memory device, from which data is read from a selected cell, in accordance with illustrative embodiments of the present invention. Although FIGS. 2 to 4 illustrate NAND type flash memory devices, the features and implementation of the present invention may be employed in other non-volatile semiconductor memory devices, such as a NOR type flash memory device, or in volatile semiconductor memory devices, such as a dynamic random access memory (DRAM) device, a static random access memory (SRAM) device, etc.

Referring to FIGS. 2 to 4, the NAND type flash memory device may include string select transistors SST electrically connected to each of multiple bit lines B/L0 to B/Ln−1, ground select transistors GST electrically connected to a common source line CSL, and memory cells electrically connected to one another in serial between the string select transistors SST and the ground select transistors GST. The memory cells are also electrically connected to word lines W/L0 to W/L31.

In FIG. 2, a selected cell SC is located at an intersection of bit line B/L1 and word line W/L 29, for purposes of illustration. A bit line read voltage V may be applied to the bit line B/L1 electrically connected to the selected cell SC. In an embodiment, the bit line read voltage V may be about 0.7V, for example.

A selected cell read voltage Vread may be applied to the word line W/L29, electrically connected to the selected cell SC. In an example embodiment, the selected cell read voltage Vread may be in a range between a first threshold voltage and a second threshold voltage. The first threshold voltage may be a threshold voltage at which data "0" is stored in the selected cell SC and the second threshold voltage may be a threshold voltage at which data "1" is stored in the selected cell SC. In example embodiments, when the first threshold voltage and the second threshold voltage have opposite polarities, the selected cell read voltage Vread may be about 0V.

In various embodiments, when the NAND type flash memory device has multi-level chip construction, each of the memory cells may hold data of N bits having corresponding threshold voltages of $2^N$. Thus, the selected cell read voltage Vread may be applied to the word lines electrically connected to the selected cell SC according to the threshold voltage of $2^N$ in order to confirm data stored in the selected cell SC.

A first read voltage Vread1 is applied to word lines of non-selected cells in a selected string, which are not adjacent to the selected cell SC. For instance, in the example depicted in FIG. 2, the first read voltage Vread1 is applied to word lines W/L0 to W/L27 and W/L 31 electrically connected to first non-selected cells NSC in the selected string to which the selected cell SC is attached. The first non-selected cells NSC are separated from the selected cell SC, and thus the first read voltage Vread1 is not applied to word lines W/L28 and W/L30 electrically connected to non-selected cells adjacent to the selected cell SC. The first read voltage Vread1 turns on the first non-selected cells NSC regardless of data stored in the first non-selected cells NSC. Thus, the first read voltage Vread1 may be substantially higher than a maximum threshold voltage of programmed cells in the first non-selected cells NSC and substantially lower than a programming voltage Vprogramming for programming data in the memory cells. For example, the first read voltage Vread1 may have an intermediate value between the maximum threshold voltage of the programmed cells in the first non-selected cells NSC and the programming voltage Vprogramming.

In an example embodiment, the threshold voltage of the programmed cells may be in a range of about 3.8V to about 4.2V and the programming voltage Vprogramming may be about 6V in the NAND type flash memory device, for example. In this case, the first read voltage Vread1 may be in a range of about 5V to about 5.5V.

Also, when the NAND type flash memory device has a multi-level chip, the first read voltage Vread1 may be substantially higher than the maximum threshold voltage of the programmed cells in first the non-selected cells NSC.

A second read voltage Vread2 is applied to word lines of the non-selected cells in the selected string that are adjacent the selected cell SC. For instance, in the example depicted in FIG. 2, the second read voltage Vread2 is applied to word lines W/L28 and W/L30 electrically connected to second non-selected cells ASC1 and ASC2 adjacent to the selected cell SC. In an embodiment, the second read voltage Vread2 may be substantially lower than the first read voltage Vread1 to inhibit generation of a fringe field which affects the threshold voltage of the selected cell SC. Also, the second read voltage Vread2 may be substantially higher than a maximum threshold voltage of programmed cells in the second non-selected cells ASC1 and ASC2. Hence, when the second read voltage Vread2 is applied to the word lines W/L28 and W/L 30 electrically connected to the second non-selected cells ASC1 and ASC2 adjacent to the selected cell SC, the second non-selected cells ASC1 and ASC2 are turned on.

In example embodiments, the second read voltage Vread2 may be about 70% to about 90% of the first read voltage Vread1, for example. When the second read voltage Vread2 is substantially lower than about 70% of the first read voltage Vread1, the second read voltage Vread2 may be substantially lower than the threshold voltage of the programmed second non-selected cells ASC1 and ASC2. When the second read voltage Vread2 is substantially higher than about 90% of the first read voltage Vread1, the fringe field may be generated.

In example embodiments, the threshold voltage of the second non-selected cells ASC1 and ASC2 may be in a range of about 3.8V to about 4.2V and the first read voltage Vread1 may be about 5V to about 5.5V. In this case, the second read voltage Vread2 may be about 4.5V to about 5V.

A pass voltage is applied to a string select line SSL and a ground select line GSL. The pass voltage may turn on a string select transistor SST and a ground select transistor GST electrically connected to the selected string. In an embodiment, the pass voltage may be substantially the same as the first read voltage Vread1.

In example embodiments, about 0V (or ground GND) may be applied to the common source line CSL electrically connected to the selected string and a bulk substrate. Also, in example embodiments, a voltage of about 0V may be applied to the bit lines electrically connected to strings other than the selected string.

An electrical signal output from the selected string may be compared with a standard signal to read data stored in the selected cell SC.

As described above, when voltages are applied to each of the elements in the NAND type flash memory device, a current in the bit line electrically connected to the selected cell SC may be changed according to the data stored in the selected cell SC. In various embodiments, when data are programmed in the selected cell SC, the selected cell SC may not be turned on, and thus the current in the bit line electrically connected to the selected cell SC may be substantially lower than a standard current.

When data are erased from the selected cell SC, the selected cell SC may be turned on, and thus the current in the bit line electrically connected to the selected cell SC may be substantially higher than the standard current. In other example embodiments, data stored in the selected cell SC may be confirmed by comparing the voltage of the bit line electrically connected to the selected cell SC with the standard voltage.

In various embodiments, the second read voltage Vread2 substantially lower than the first read voltage Vread1 may be applied to the second non-selected cells ASC1 and ASC2 adjacent to the selected cell SC. Therefore, an increase of the threshold voltage of the selected cell SC due to the second read voltage Vread2 may be prevented to reduce a change of data stored in the selected cell SC or an incorrect reading operation caused by the increase of the threshold voltage.

When the distance between memory cells is relatively short, e.g., due to the NAND type flash memory device having a high degree of integration, the fringe field caused by the word lines electrically connected to the second non-selected cells ASC1 and ASC2 adjacent to the selected cell SC may largely affect the threshold voltage of the selected cell SC. Furthermore, in the multi-level chip, differences in threshold voltages according to the data stored in the cells may not be large, and thus an increase of the threshold voltage of the selected cell SC due to the fringe field may cause data to be changed or read operations to be incorrect. Therefore, the methods of reading data in accordance with the example embodiments of the present invention may also be effectively used for the multi-level chips.

Figure 5:
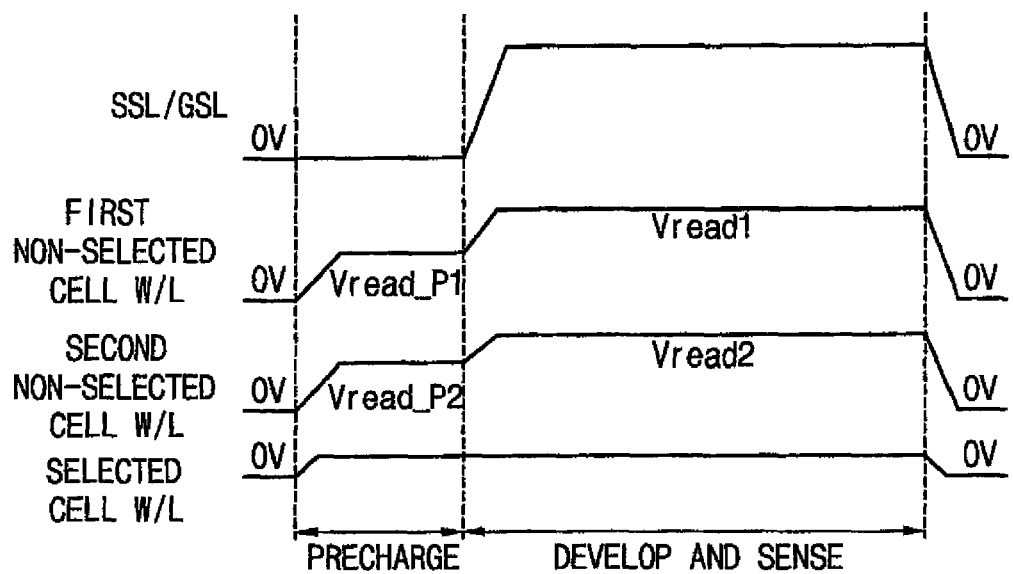
FIGS. 5 to 7 are timing diagrams illustrating voltages applied to memory cells of a NAND type flash memory device, in accordance with example embodiments of the present invention.

FIG. 5 is a timing diagram illustrating voltages applied to elements of memory cells in a NAND type flash memory device, in accordance with example embodiments of the present invention. An example method of reading data from the memory cells of the NAND type flash memory device is described below with reference with to FIGS. 2 and 5.

Precharge voltages may be applied to word lines electrically connected to non-selected cells including first non-selected cells NSC and second non-selected cells ASC1 and ASC2. In example embodiments, the precharge voltage may be applied to word lines W/L0 to W/L27 and W/L31 electrically connected to the first non-selected cells NSC and word lines W/L28 and W/L30 electrically connected to the second non-selected cells ASC1 and ASC2, to precharge the respective word lines, as illustrated in FIG. 5.

A bit line B/L1 electrically connected to a selected cell SC may be grounded. When the bit line B/L1 electrically connected to the selected cell SC is grounded, the selected cell SC may be in a wait condition in a reading operation. A voltage of about 0V may be applied to bit lines electrically connected to the non-selected cells.

A selected cell read voltage Vread may be applied to a word line to which the selected cell is attached, e.g., word line W/L29 electrically connected to the selected cell SC. The selected cell read voltage Vread has a value in a range between a first threshold voltage and a second threshold voltage. The first threshold voltage may be a threshold voltage at which data "0" is stored in the selected cell SC, and the second threshold voltage may be a threshold voltage at which data "1" is stored in the selected cell SC. In various example embodiments, the first threshold voltage and the second threshold voltage may have opposite polarities, and the selected cell read voltage Vread may be about 0V.

When the NAND type flash memory device has a multi-level chip, for example, each of the memory cells may hold data of about N bits corresponding to threshold voltage of about $2^N$. Thus, the selected cell read voltage Vread may be applied to the selected cell SC according to the threshold voltage of about $2^N$ in order to confirm data stored in the selected cell SC.

As shown in FIG. 5, a first precharge voltage Vread_P1 is applied to the word lines W/L1 to W/L27 and W/L31 electrically connected to first non-selected cells NSC of the selected string to which the selected cell SC is attached. The first non-selected cells NSC are separated from (e.g., not adjacent to) the selected cell SC. In various embodiments, the first precharge voltage Vread_P1 may be substantially lower than a first read voltage Vread1 applied to the word lines W/L1 to W/L27 and W/L31 electrically connected to the first non-selected cells NSC for developing and sensing data stored in the selected cell SC. For example, the first precharge voltage Vread_P1 may be about 50% of the first read voltage Vread1.

Also, a second precharge voltage Vread_P2 may be applied to the word lines W/L28 and W/L30 electrically connected to second non-selected cells ASC1 and ASC2 adjacent to the selected cell SC. In various embodiments, the second precharge voltage Vread_P2 may be substantially lower than a second read voltage Vread2 applied to the word lines W/L28 and W/L30 electrically connected to the second non-selected cells ASC1 and ASC2 for developing and sensing data stored in the selected cell SC.

In an example embodiment, the second precharge voltage Vread_P2 may be substantially the same as the first precharge voltage Vread_P1. In another example embodiment, the second precharge voltage Vread_P2 may be substantially lower than the first precharge voltage Vread_P1.

When the first and second precharge voltages Vread_P1 and Vread_P2 are applied to the word lines electrically connected to the first and second non-selected cells NSC, ASC1 and ASC2, respectively, a voltage difference between the word line W/L29 and the adjacent word lines W/L28 and W/L30 is generated. However, the first and second precharge voltages Vread_P1 and Vread_P2 are substantially lower than the first and the second read voltage Vread1 and Vread2, so that the voltage difference between the word line W/L29 and the word lines W/L28 and W/L30 is relatively small. Therefore, the threshold voltage in the selected cell SC will not be increased.

In various embodiments, a voltage of about 0V may be applied to a string select line SSL and a ground select line GSL electrically connected to the selected string. Therefore, a string select transistor SST and a ground selected transistor GST are not turned on. Also, a voltage of about 0V may be applied to a common source line CSL and a bulk substrate electrically connected to the selected string to which the selected cell SC is attached. As described above, the voltages may be applied to each of the elements to precharge the selected cell SC and the first and second the non-selected cells.

After precharging each of the word lines, a developing step and a sensing step may be performed to read data from the selected cell SC. Voltages may be applied to the word lines for the developing step and the sensing step as illustrated in FIG. 5.

A bit line read voltage is applied to a bit line B/L1 electrically connected to the selected cell SC. In example embodiments, the bit line read voltage may be about 0.7V, for example.

The selected cell read voltage Vread is applied to the word line W/L29 electrically connected to the selected cell SC. The selected cell read voltage Vread may be in a range between the first threshold voltage and the second threshold voltage, for example. As stated above, the first threshold voltage may be a threshold voltage when data 0 is stored in the selected cell, and the second threshold voltage may be a threshold voltage when data 1 is stored in the selected cell.

The first read voltage Vread1 may be applied to the word lines W/L1 to W/L27 and W/L31 electrically connected to the first non-selected cells NSC. The first read voltage Vread1 may be substantially higher than the first precharge voltage Vread_P1.

In example embodiments, the first read voltage Vread1 may turn on the first non-selected cells NSC regardless of data stored in the first non-selected cells NSC. Therefore, the first read voltage Vread1 may substantially higher than a maximum threshold voltage of the first non-selected cell NSC storing data. The first read voltage Vread1 may be substantially lower than a programming voltage which programs data into the memory cells. For example, the first read voltage Vread1 may have an intermediate value between the maximum threshold voltage in the first non-selected cells NSC and the programming voltage. When the NAND type flash memory device has a multi-level chip, the first read voltage Vread1 may be substantially higher than the maximum threshold voltage.

The second read voltage Vread2 is applied to the word lines W/L28 and W/L30 electrically connected to the second non-selected cells ASC1 and ASC2. The second read voltage Vread2 may be substantially lower than the first read voltage Vread1 and substantially higher than the second precharge voltage Vread_P2, for example. The second read voltage Vread2 may be relatively low to inhibit a fringe field affecting the threshold voltage of the selected cell SC. The second read voltage Vread2 may be substantially higher than a maximum threshold voltage of the second non-selected cells ASC1 and ASC2 storing data. When the second read voltage Vread2 is applied to the word lines W/L28 and W/L30 electrically connected to the second non-selected cells ASC1 and ASC2, the second non-selected cells ASC1 and ASC2 may be turned on. In example embodiments, the second read voltage Vread2 may be about 70% to about 90% of the first read voltage Vread1.

When the first and second read voltages Vread1 and Vread2 are applied to the word lines W/L0 to W/L28, W/L30 and W/L31, respectively, without applying the first and second precharge voltages Vread_P1 and Vread_P2, coupling noise may be generated. The first and the second precharge voltages Vread_P1 and Vread_P2 may therefore be applied to the word lines W/L0 to W/L28, W/L30 and W/L31, respectively, to prevent generation of the coupling noise before the first read voltage Vread1 is applied to the word lines W/L0 to W/L27 and W/L31 electrically connected the first non-selected cells NSC, and the second read voltage Vread2 is applied to the word lines W/L28 and W/L30 electrically connected the second non-selected cells ASC1 and ASC2, respectively.

A pass voltage for turning on the string select transistor SST and the ground select transistor GST may be applied to the corresponding string select line SSL and the ground select line GSL electrically connected to the selected string. The pass voltage may be substantially the same as the first read voltage Vread1, for example.

In example embodiments, a voltage of about 0V may be applied to the common source line CSL electrically connected to the selected string and the bulk substrate. Also, a voltage of about 0V may be applied to bit lines electrically connected to the stings other than the selected string.

An electrical signal output from the selected string may be compared to a standard electrical signal, such as a standard current or a standard voltage, to read data stored in the selected cell SC.

As described above, when the word lines electrically connected to the non-selected cells are precharged and data stored in the selected cell are read, the influence of the non-selected cells on the selected cell is decreased, enabling the data stored in the selected cell SC to be correctly read.

Figure 6:
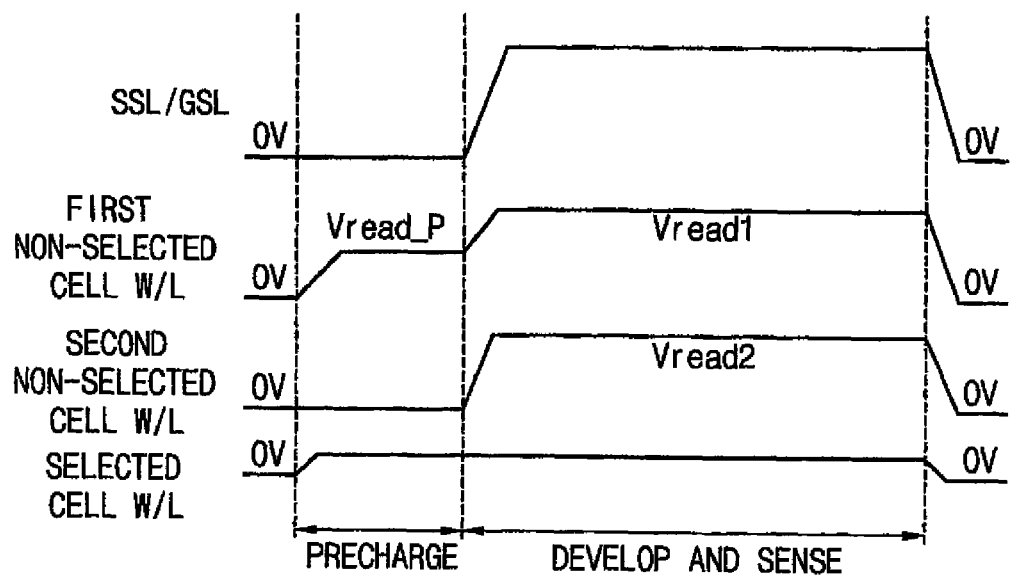

FIG. 6 is a timing diagram illustrating voltages applied to elements of memory cells in a NAND type flash memory device, in accordance with example embodiments of the present invention. The method is substantially the same as the above-described method, expect a precharging step is not performed on the second non-selected cells ASC1 and ASC2.

Referring to FIGS. 2 and 6, a voltage of about 0V is applied to a bit line electrically connected to a selected cell SC (e.g., bit line B/L1). A selected cell read voltage Vread is applied to a word line W/L 29 electrically connected to the selected cell SC.

A precharge voltage Vread_P is applied to word lines W/L0 to W/L27 and W/L31 electrically connected to first non-selected cells NSC in a selected string to which the selected cell is attached. First non-selected cells NSC are separated from (e.g., not adjacent to) the selected cell SC. In example embodiments, the precharge voltage Vread_P is substantially lower than a first read voltage Vread1 applied to the word lines W/L1 to W/L27 and W/L31 electrically connected to the first non-selected cells NSC for a developing step and a sensing step. For example, the precharge voltage Vread_P may be about 50% of the first read voltage Vread1.

In example embodiments, a voltage of about 0V is applied to word lines W/L28 and W/L30 electrically connected to second non-selected cells ASC1 and ASC2. Voltages may be applied to other elements through substantially the same method as described above.

After precharging the memory cells, developing and sensing steps are performed. The developing and sensing steps may also be performed substantially the same as in the above-described method.

When the precharge voltage Vread_P is applied to only the first non-selected cells NSC, changes of the threshold voltage by the second non-selected cells ASC1 and ASC2 in the selected cell SC may be inhibited.

Figure 7:
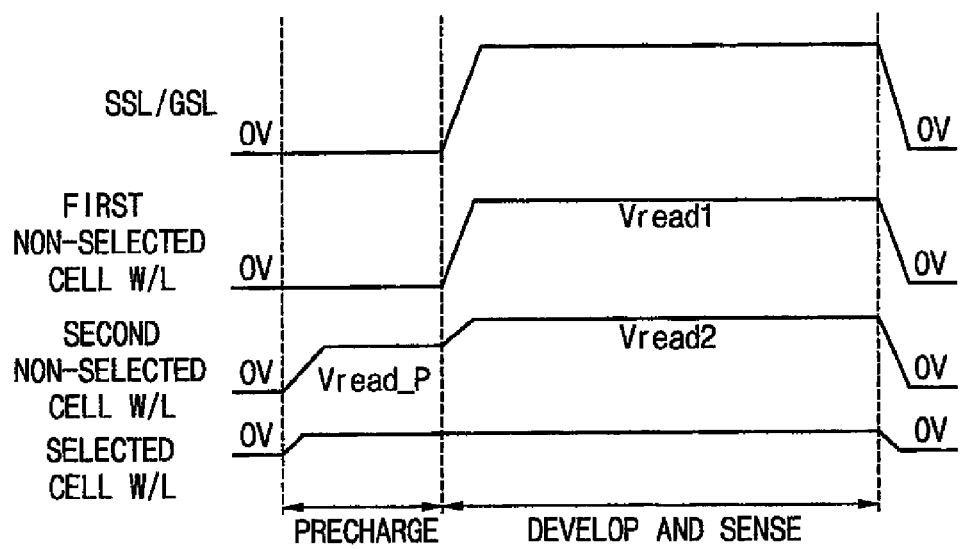

FIG. 7 is a timing diagram illustrating voltages applied to elements of memory cells in a NAND type flash memory device, in accordance with example embodiments of the present invention. The method is substantially the same as the above-described method, expect a precharging step is not performed on the first non-selected cells NSC.

Referring to FIGS. 2 and 7, a voltage of about 0V is applied to a bit line electrically connected to a selected cell SC (e.g., bit line B/L1), and a selected cell read voltage Vread is applied to a word line W/L 29 electrically connected to the selected cell SC.

In example embodiments, a voltage of about 0V may be applied to word lines W/L0 to W/L27 and W/L31 electrically connected to first non-selected cells NSC in a selected string to which the selected cell is attached. A precharge voltage Vread_P is applied to word lines W/L 28 and W/L 30 electrically connected to second non-selected cells ASC1 and ASC2, which are adjacent to the selected cell SC. The precharge voltage Vread_P may substantially lower than a second read voltage Vread2 applied to the word lines W/L28 and W/L30 electrically connected to the second non-selected cells ASC1 and ASC2 for a developing step and a sensing step. Voltages may be applied to other elements through substantially the same method as described above.

After precharging the memory cells, developing and sensing steps are performed. The developing and sensing steps may also be substantially the same as those of the above-described method.

Examples according to various embodiments of the present invention are described below with reference to evaluation of a threshold voltage in a selected cell. However, it is understood that the present invention is not be limited to the following Examples, but various changes and modifications may be made by one of ordinary skill in the art within the spirit and scope of the present invention.

EXPERIMENT 1

Voltages were applied to word lines in a NAND type flash memory device, and then threshold voltages were measured in selected cells. In the NAND type flash memory device, a first read voltage was applied to word lines electrically connected to first non-selected cells not adjacent to the selected cell. A second read voltage was applied to word lines electrically connected to second non-selected cells adjacent to the selected cell. A maximum threshold voltage of the memory cells in which data were programmed was about 4.2V.

While the first read voltage of about 5.5V was applied to the word lines electrically connected to the first non-selected cells, the second read voltages of about 4.6V, about 5.0V and about 5.5V were applied to the word lines electrically connected to the second non-selected cells, respectively. The threshold voltages of the selected cells were measured, respectively. The results are illustrated in FIG. 8.

Figure 8:
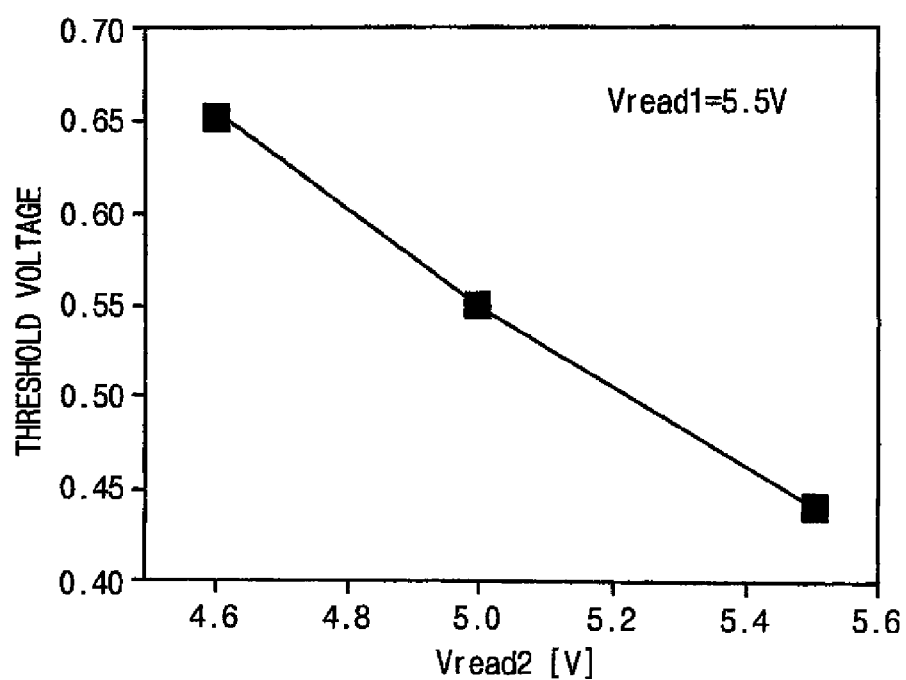
FIG. 8 is a graph illustrating measured threshold voltage of a selected cell in response to a fixed first read voltage and a varying second read voltage, in accordance with example embodiments of the present invention.

Referring to FIG. 8, with the first read voltage fixed (e.g., at 5.5V), the threshold voltage in the selected cell varied inversely proportionally to the second read voltage. As the second read voltage increased (e.g., from approximately 4.6V to 5.5V), the threshold voltage of the selected cell decreased. This indicates that the second non-selected cells adjacent to the selected cell affect the threshold voltage of the selected cell.

EXPERIMENT 2

Voltages were applied to word lines in a NAND type flash memory device through substantially the same method discussed above with respect to Example 1, except for the values of first and second read voltages applied to word lines electrically connected to first and second non-selected cells, respectively. While a second read voltage of about 4.6V was applied to the word lines electrically connected to the second non-selected cells, first read voltages of about 4.6V, about 5.0V and about 5.5V were applied to the word lines electrically connected to the first non-selected cells. The threshold voltages were measured in the selected cells, respectively. The results are shown in FIG. 9.

Figure 9:
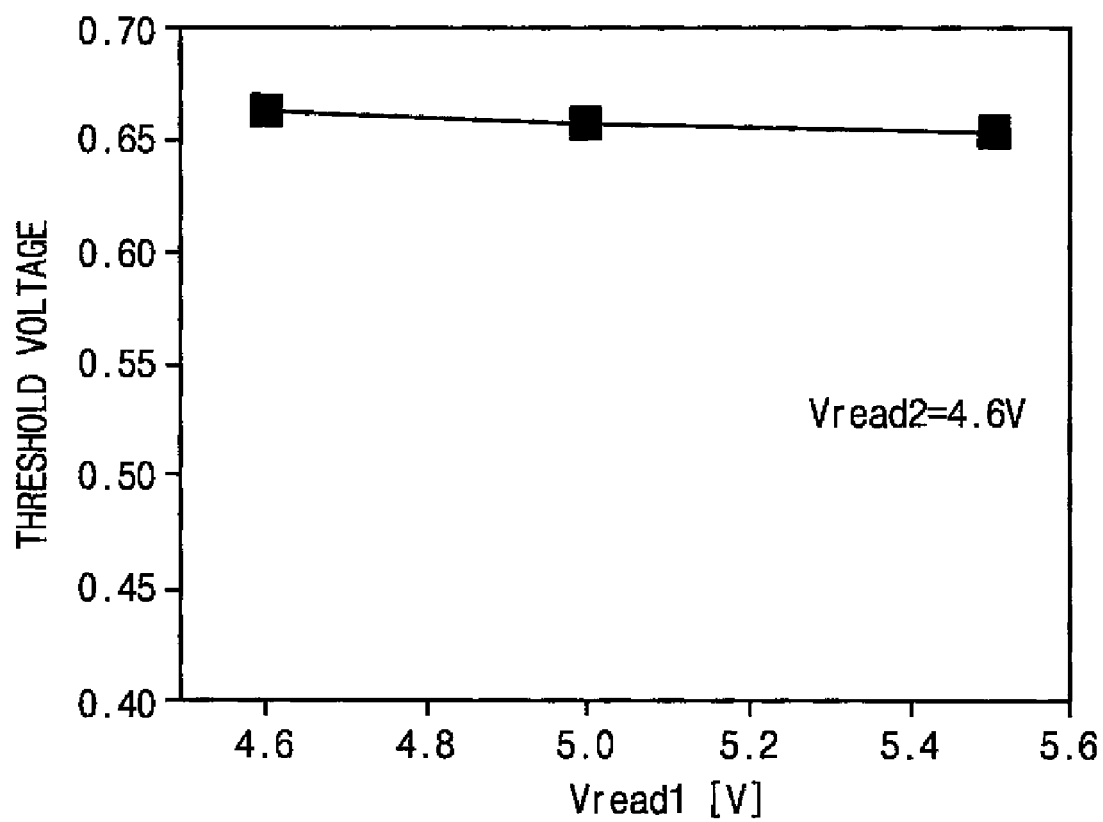
FIG. 9 is a graph illustrating measured threshold voltage of a selected cell in response to a fixed second read voltage and a varying first read voltage, in accordance with example embodiments of the present invention.

Referring to FIG. 9, when the second read voltage of about 4.6V, which is substantially higher than the maximum threshold voltage by about 0.4V, was applied to the word lines electrically connected to the second non-selected cells, the threshold voltage of the selected cell did not change according to the first read voltage. As the first read voltage increased (e.g., from approximately 4.6V to 5.5V), the threshold voltage of the selected cell remained substantially the same. Therefore, when the second read voltage is kept low, the threshold voltage of the selected cell may not change during the reading operation.

As described above, the relatively low second read voltage Vread2 may be applied to the second non-selected cells ASC1 and ASC2 adjacent the selected cell SC to inhibit the threshold voltage of the selected cell SC from increasing, e.g., due to coupling noise. Accordingly, the reading operation of the non-volatile memory device may be improved by preventing failure of the reading operation and/or changing of data stored in the selected cell SC.

The reading operation according to the example embodiments of the present invention may be applied to non-volatile memory devices in which a storage node includes polysilicon, silicon nitride, nano-crystal or a metal, for example.

Also, according to the embodiments, a relatively low voltage may be applied to the non-selected cells adjacent to the selected cell to reduce coupling noise and interference between the selected cell and the non-selected cells adjacent to the selected cell. Thus, a failure of a reading operation may be prevented by inhibiting the threshold voltage of the selected cell from changing.

The foregoing is illustrative of the present invention and is not to be construed as limiting thereof. While the present invention has been described with reference to example embodiments, it will be apparent to those skilled in the art that various changes and modifications may be made without departing from the spirit and scope of the present invention. In the claims, any means-plus-function clauses are intended to cover structures described herein as performing the recited function and not only structural equivalents but also equivalent structures. Therefore, it should be understood that the above embodiments are not limiting, but illustrative.

What is claimed is:

1. A method of reading data from a non-volatile memory device, comprising:

applying a bit line read voltage to a bit line electrically connected to a selected cell located in a selected string;

applying a selected cell read voltage to a word line electrically connected to the selected cell;

applying a first read voltage to word lines electrically connected to first non-selected cells in the selected string, the first non-selected cells being separated from the selected cell;

applying a second read voltage to word lines electrically connected to second non-selected cells in the selected string, the second non-selected cells being adjacent to the selected cell, the second read voltage inhibiting a fringe field affecting a threshold voltage of the selected cell and being substantially lower than the first read voltage;

applying a pass voltage to a string select line and a ground select line, electrically connected to the selected string, for turning on a string select transistor and a ground select transistor, respectively; and comparing an electrical signal output from the selected string with a standard signal to read data stored in the selected cell.

2. The method of claim 1, wherein the first read voltage and the second read voltage are substantially higher than a maximum threshold voltage of programmed memory cells.

3. The method of claim 2, wherein the first read voltage is substantially lower than a programming voltage for programming the memory cells.

4. The method of claim 1, wherein the second read voltage is within a range of about 70% to about 90% of the first read voltage.

5. The method of claim 1, further comprising:
applying a voltage of about 0V to a common source line electrically connected to the selected string and a bulk substrate.

6. The method of claim 1, further comprising:
applying a voltage of about 0V to bit lines electrically connected to strings other than the selected string.

7. The method of claim 1, wherein the pass voltage is substantially the same as the first read voltage.

8. A method of reading data stored in a selected cell in a selected string of a non-volatile memory device, the method comprising:

applying a precharge voltage to at least one of word lines electrically connected to first non-selected cells, which are not adjacent to the selected cell in the selected string, and word lines electrically connected to second non-selected cells, which are adjacent to the selected cell in the selected string, to precharge at least one of the first non-selected cells and the second non-selected cells;

applying a selected cell read voltage to a word line electrically connected to the selected cell;

applying a bit line read voltage to a bit line electrically connected to the selected cell, while applying the precharge voltage;

applying a pass voltage for turning on a string select transistor and a ground select transistor to a string select line and a ground select line electrically connected to the selected string, while applying the precharge voltage;

applying a first read voltage substantially higher than the precharge voltage to the word lines electrically connected to the first non-selected cells after applying the precharge voltage;

applying a second read voltage substantially higher than the precharge voltage and substantially lower than the first read voltage to the word lines electrically connected to the second non-selected cells after applying the precharge voltage; and comparing an electrical signal output from the selected string with a standard signal to read the data stored in the selected cell.

9. The method of claim 8, wherein applying the precharge voltage comprises applying the precharge voltage to both the word lines electrically connected to the first non-selected cells and the word lines electrically connected to the second non-selected cells.

10. The method of claim 8, wherein applying the precharge voltage comprises applying the precharge voltage to only the word lines electrically connected to the first non-selected cells.

11. The method of claim 8, wherein applying the precharge voltage comprises applying the precharge voltage to only the word lines electrically connected to the second non-selected cells.

12. The method of claim 8, wherein the precharge voltage is in a range of about 30% to about 80% of the second read voltage.

13. The method of claim 8, wherein the first read voltage and the second read voltage are each substantially higher than a maximum threshold voltage of programmed memory cells and substantially lower than a programming voltage for programming the memory cells.

14. The method of claim 8, wherein the second read voltage is in a range of about 70% to about 90% of the first read voltage.

15. The method of claim 8, further comprising:
applying a voltage of about 0V to bit lines electrically connected to strings other than the selected string.

16. The method of claim 8, wherein the pass voltage is substantially the same as the first read voltage.

* * * * *